United States Patent
Iyama et al.

(10) Patent No.: US 12,445,106 B2
(45) Date of Patent: Oct. 14, 2025

(54) ACOUSTIC WAVE DEVICE

(71) Applicant: Murata Manufacturing Co., Ltd., Nagaokakyo (JP)

(72) Inventors: Akihiro Iyama, Nagaokakyo (JP); Yuta Ishii, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 219 days.

(21) Appl. No.: 18/369,897

(22) Filed: Sep. 19, 2023

(65) Prior Publication Data

US 2024/0014801 A1    Jan. 11, 2024

Related U.S. Application Data

(63) Continuation of application No. PCT/JP2022/016189, filed on Mar. 30, 2022.

(60) Provisional application No. 63/169,282, filed on Apr. 1, 2021.

(51) Int. Cl.
  *H03H 9/17* (2006.01)
  *H03H 9/02* (2006.01)

(52) U.S. Cl.
  CPC ........ *H03H 9/174* (2013.01); *H03H 9/02015* (2013.01); *H03H 9/02228* (2013.01)

(58) Field of Classification Search
  CPC .... H03H 9/02062; H03H 9/173; H03H 9/174; H03H 9/02015; H03H 9/02228; H03H 9/175; H03H 9/02118
  See application file for complete search history.

(56) References Cited

U.S. PATENT DOCUMENTS

| | | | |
|---|---|---|---|
| 4,672,254 A | 6/1987 | Dolat et al. | |
| 10,707,830 B2* | 7/2020 | Kikuchi | H03H 9/02637 |
| 2012/0313483 A1 | 12/2012 | Matsuda et al. | |
| 2016/0277003 A1* | 9/2016 | Kikuchi | H03H 9/14541 |

(Continued)

FOREIGN PATENT DOCUMENTS

| | | |
|---|---|---|
| JP | 2011182096 A | 9/2011 |
| JP | 2012257019 A | 12/2012 |

(Continued)

OTHER PUBLICATIONS

International Search Report in PCT/JP2022/016189, mailed Jul. 5, 2022, 3 pages.

(Continued)

*Primary Examiner* — Quan Tra
(74) *Attorney, Agent, or Firm* — Keating & Bennett, LLP

(57) ABSTRACT

An acoustic wave device includes a support substrate, a piezoelectric layer, a functional electrode, a first trace, a second trace, and an attenuation layer. The piezoelectric layer is located on the support substrate and includes first and second main surfaces on opposite sides. The functional electrode is located on the first or second main surface of the piezoelectric layer. The first trace is located on the piezoelectric layer and connected to the functional electrode. The second trace is located on the piezoelectric layer and faces the first trace. The first and second traces are connected to different potentials. The attenuation layer is located between the first trace and the second trace when viewed in plan. The attenuation layer is made of a dielectric material lower in density than the piezoelectric layer.

20 Claims, 12 Drawing Sheets

(56) References Cited

U.S. PATENT DOCUMENTS

| | | |
|---|---|---|
| 2016/0380611 A1 | 12/2016 | Kai |
| 2018/0069528 A1* | 3/2018 | Qiu .................. H03H 9/173 |
| 2019/0305748 A1* | 10/2019 | Yamane ............. H03H 9/25 |
| 2021/0036209 A1* | 2/2021 | Osawa ............... H10N 30/88 |
| 2022/0038073 A1* | 2/2022 | Kishimoto ......... H03H 9/175 |
| 2023/0179171 A1* | 6/2023 | Yasuda ............. H03H 9/0552 |
| | | 333/193 |

FOREIGN PATENT DOCUMENTS

| | | |
|---|---|---|
| JP | 2017011681 A | 1/2017 |
| JP | 2019179961 A | 10/2019 |

OTHER PUBLICATIONS

Written Opinion in PCT/JP2022/016189, mailed Jul. 5, 2022, 3 pages.

\* cited by examiner

ACOUSTIC WAVE DEVICE

CROSS REFERENCE TO RELATED APPLICATIONS

This application claims the benefit of priority to Provisional Patent Application No. 63/169,282 filed on Apr. 1, 2021 and is a Continuation Application of PCT Application No. PCT/JP2022/016189 filed on Mar. 30, 2022. The entire contents of each application are hereby incorporated herein by reference.

BACKGROUND OF THE INVENTION

1. Field of the Invention

The present invention relates to an acoustic wave device.

2. Description of the Related Art

A known acoustic wave device uses plate waves propagating through a piezoelectric film made of $LiNbO_3$ or $LiTaO_3$. For example, Japanese Unexamined Patent Application Publication No. 2012-257019 discloses an acoustic wave device that uses Lamb waves, which are plate waves. The acoustic wave device includes a support and a piezoelectric substrate disposed on the support. The piezoelectric substrate is made of $LiNbO_3$ or $LiTaO_3$. An interdigital transducer (IDT) electrode is disposed on an upper surface of the piezoelectric substrate. With two arrays of electrode fingers being included in the IDT electrode and connected to different potentials, a voltage is applied between one of the arrays of electrode fingers and the other array of electrode fingers. As a result, Lamb waves are excited. Two reflectors are disposed with the IDT electrode therebetween. These components define an acoustic wave resonator that uses plate waves.

An example of a ladder filter is disclosed in Japanese Unexamined Patent Application Publication No. 2011-182096. The ladder filter includes acoustic wave devices connected to each other by wiring. The wiring includes a trace connected to the HOT potential and a trace connected to the ground (GND) potential. The trace connected to the HOT potential and the trace connected to the GND potential face each other.

SUMMARY OF THE INVENTION

An unwanted bulk wave can undergo excitation in an acoustic wave resonator such as the one described in Japanese Unexamined Patent Application Publication No. 2012-257019. The bulk wave propagates in the thickness direction of the piezoelectric substrate. Consequently, the bulk wave can be reflected by the support. As for the filter disclosed in Japanese Unexamined Patent Application Publication No. 2011-182096, one of the traces connected to different potentials and facing each other can pick up an unwanted bulk wave signal. In some cases, one of busbars facing each other picks up an unwanted bulk wave signal. Such a reflected signal or an unwanted bulk wave signal can cause ripples in the frequency characteristics of the acoustic wave device.

Preferred embodiments of the present invention provide acoustic wave devices that each reduce ripples in frequency characteristics.

An acoustic wave device according to the present invention includes a support substrate, a piezoelectric layer, a functional electrode, a first trace, a second trace, and an attenuation layer. The piezoelectric layer is located on the support substrate and includes a first main surface and a second main surface on opposite sides. The functional electrode is located on the first main surface or the second main surface of the piezoelectric layer. The first trace is located on the piezoelectric layer and connected to the functional electrode. The second trace is located on the piezoelectric layer and faces the first trace. The first trace and the second trace are connected to different potentials. The attenuation layer is located between the first trace and the second trace when viewed in plan. The attenuation layer is made of a dielectric material lower in density than the piezoelectric layer.

The acoustic wave devices according to preferred embodiments of the present invention each reduce ripples in frequency characteristics.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention is clarified by way of preferred embodiments, which are described below with reference to the accompanying drawings.

It should be noted that the preferred embodiments described herein are illustrative examples, and partial replacements or combinations of configurations illustrated in different preferred embodiments are possible.

Figure 1:
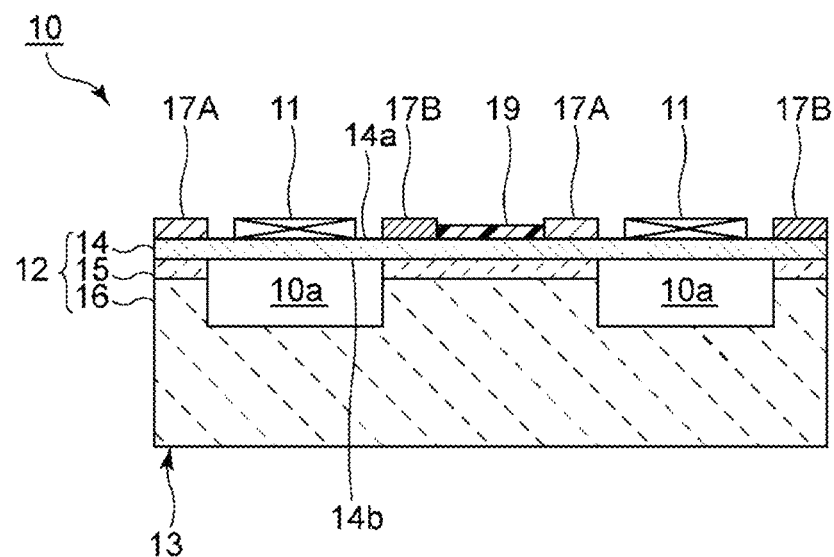
FIG. 1 is a sectional view of an acoustic wave device according to a first preferred embodiment of the present invention, schematically illustrating the acoustic wave device viewed from the front.

FIG. 1 is a sectional view of an acoustic wave device according to a first preferred embodiment of the present invention, schematically illustrating the acoustic wave device viewed from the front. IDT electrodes in FIG. 1 are each indicated in simplified form by a rectangle with two diagonal lines. The same holds true for the other schematic sectional front views in the accompanying drawings.

An acoustic wave device 10 includes a piezoelectric substrate 12 and IDT electrodes 11. The IDT electrodes 11 are functional electrodes. The piezoelectric substrate 12 includes a support 13 and a piezoelectric layer 14. The support 13 in the present preferred embodiment includes a support substrate 16 and an insulating layer 15. The insulating layer 15 is disposed on the support substrate 16. The piezoelectric layer 14 is disposed on the insulating layer 15. In some preferred embodiments, however, the support 13 includes the support substrate 16 only.

The piezoelectric layer 14 includes a first main surface 14a and a second main surface 14b. The first main surface 14a and the second main surface 14b are located on opposite sides. The second main surface 14b is closer than the first main surface 14a to the support 13.

The support substrate 16 may be made of a semiconducting material, such as silicon or may be made of a ceramic material, such as aluminum oxide. The insulating layer 15 may be made of a suitable dielectric material, such as silicon oxide or tantalum pentoxide. The piezoelectric layer 14 may be made of lithium niobate, lithium tantalate, zinc oxide, aluminum nitride, quartz, or PZT (lead zirconate titanate). The piezoelectric layer 14 is preferably a layer made of lithium tantalate ($LiTaO_3$) or a layer made of lithium niobate ($LiNbO_3$).

The support 13 includes cavities 10a. More specifically, the support substrate 16 includes recesses. The insulating layer 15 includes through-holes, each of which is connected to the corresponding one of the recesses with no layer laid therebetween. This means that the support 13 includes recesses. The recesses of the support 13 are closed with the piezoelectric layer 14 disposed on the insulating layer 15 such that the cavities 10a are provided. In some preferred embodiments, however, the cavities 10a are provided in the insulating layer 15 only or in the support substrate 16 only.

It is preferred that at least one cavity 10a be provided in the support 13. The cavities 10a are each provided as an energy-trapping layer. The energy of acoustic waves is trapped in the energy-trapping layer and is thus kept from leaking through the piezoelectric layer 14. Alternatively, a multilayer acoustic film, which will be described later, may be provided in place of the cavities 10a.

The IDT electrodes 11 are disposed on the first main surface 14a of the piezoelectric layer 14. That is, acoustic wave resonators are provided on the piezoelectric layer 14. The IDT electrodes 11 each include a pair of busbars and multiple electrode fingers. The acoustic wave device 10 in the present preferred embodiment is a filter device. It is preferred that at least one IDT electrode 11 be included in the acoustic wave device 10. That is, it is preferred that at least one acoustic wave resonator be included in the acoustic wave device according to the present preferred embodiment.

The IDT electrodes 11 each at least partially overlap the cavities 10a when viewed in plan. More specifically, two or more IDT electrodes 11 defining and functioning as acoustic wave resonators may overlap the respective cavities 10a or may overlap the same cavity 10a when viewed in plan. The expression "viewed in plan" herein means that the component concerned is viewed from the upper side in FIG. 1. Furthermore, the expression "viewed in plan" means that the component concerned is viewed in the direction in which the support substrate 16 and the piezoelectric layer 14 are stacked. Referring to FIG. 1, the piezoelectric layer 14 is closer than the support substrate 16 to the upper side.

First traces 17A and second traces 17B are disposed on the piezoelectric layer 14. More specifically, the first traces 17A and the second traces 17B are disposed on the first main surface 14a of the piezoelectric layer 14. Each of the first traces 17A and the corresponding one of the second traces 17B face each other on the piezoelectric layer 14. The first traces 17A are electrically connected to the IDT electrodes 11. Each of the first traces 17A and each of the second traces 17B are connected to different potentials. At least two pairs of traces are provided in the present preferred embodiment. The first traces 17A are paired with the respective second traces 17B. Each of the first traces 17A and each of the second traces 17B are arranged with the corresponding one of the IDT electrodes 11 therebetween. The first trace 17A adjacent to one of the IDT electrodes 11 and the second trace 17B adjacent to the other IDT electrode 11 face each other.

The layout of the first traces 17A and the second traces 17B is not limited to the example mentioned above. It is preferred that at least one pair of traces (at least one first trace 17A and at least one second trace 17B) be provided. It is also preferred that the first trace 17A and the second trace 17B paired with each other at least partially face each other.

Referring to FIG. 1, an attenuation layer 19 is disposed on the piezoelectric layer 14. More specifically, the attenuation layer 19 is disposed between the first trace 17A adjacent to one of the IDT electrodes 11 and the second trace 17B adjacent to the other IDT electrode 11. The attenuation layer 19 is made of a dielectric material. The dielectric material of the attenuation layer 19 is lower in density than the piezoelectric layer 14.

The present preferred embodiment includes the following unique features. The attenuation layer 19 is disposed between the first trace 17A and the second trace 17B when viewed in plan, and the attenuation layer 19 is made of a dielectric material that is lower in density than the piezoelectric layer 14. These features reduce the degree to which the frequency characteristics are affected by unwanted bulk waves. The present preferred embodiment can thus reduce ripples in the frequency characteristics. The following elaborates on this point by way of a comparison of the present preferred embodiment and a comparative example.

Unlike the acoustic wave device according to the present preferred embodiment, an acoustic wave device according to the comparative example does not include the attenuation layer 19. The acoustic wave device having the features of the present preferred embodiment and the acoustic wave device in the comparative example were subjected to measurement of the reflection characteristics between the first trace 17A and the second trace 17B to evaluate the frequency characteristics of the respective acoustic wave devices.

Figure 2:
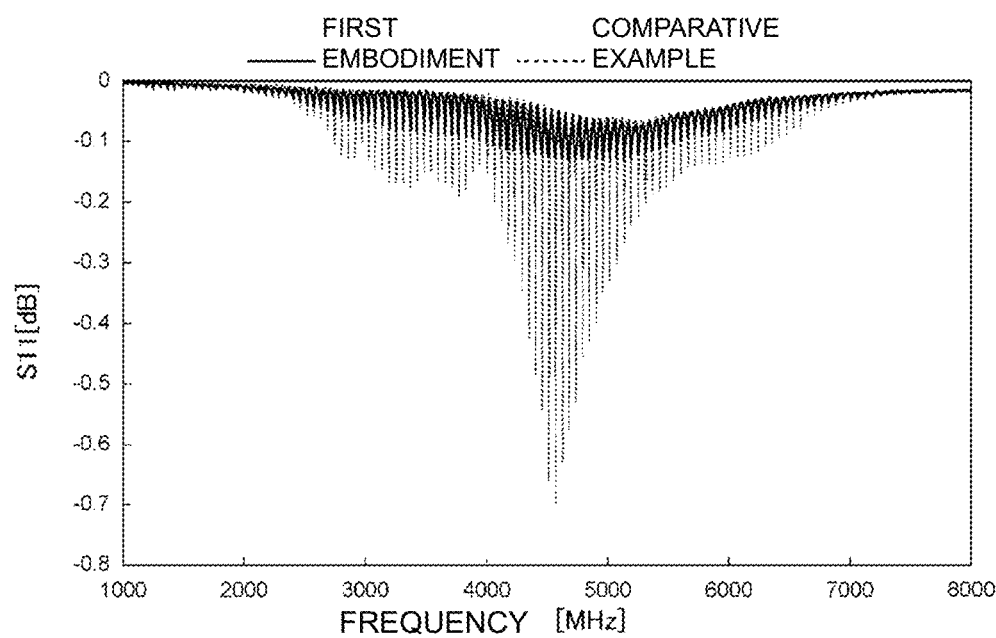
FIG. 2 illustrates the reflection characteristics exhibited in the first preferred embodiment of the present invention and the reflection characteristics exhibited in a comparative example.
Figure 3:
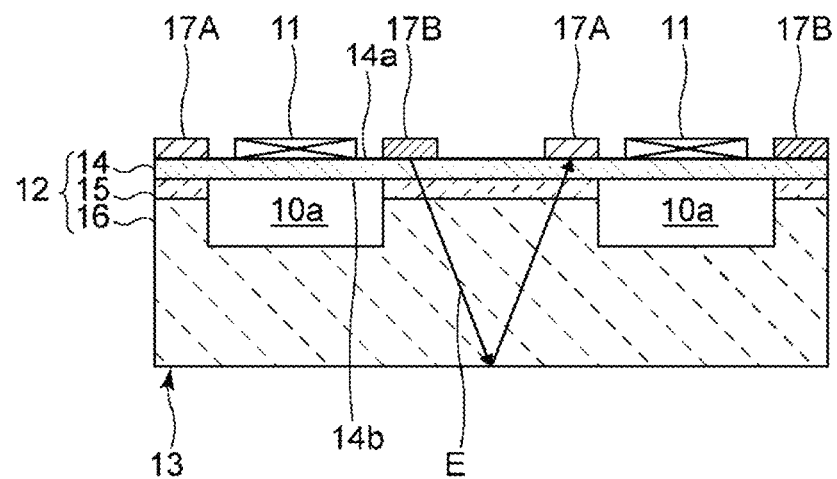
FIG. 3 is a sectional view of an acoustic wave device in the comparative example, schematically illustrating an unwanted bulk wave propagating through the acoustic wave device viewed from the front.

FIG. 2 illustrates the reflection characteristics exhibited in the first preferred embodiment and the reflection characteristics exhibited in the comparative example. The reflection characteristics in FIG. 2 are illustrated as the relationship between S11 and the frequency. FIG. 3 is a sectional view of the acoustic wave device in the comparative example, schematically illustrating an unwanted bulk wave propagating through the acoustic wave device viewed from the front. A portion of the unwanted bulk wave is denoted by an arrow E in FIG. 3.

The reflection characteristics in the comparative example are as follows. As can be seen in FIG. 2, a large ripple was observed in or near the frequency range of about 2,300 MHz to about 7,000 MHz on the scale drawn in FIG. 2. In the comparative example, an unwanted bulk wave from one of the second traces 17B can possibly be reflected off the support substrate 16, as illustrated in FIG. 3. Consequently, an unwanted bulk wave signal can possibly be picked up by one of the first traces 17A. This becomes the cause of ripples such as the one illustrated in FIG. 2. It can also be seen in FIG. 2 that such ripples in the reflection characteristics were reduced in the first preferred embodiment.

Referring to FIG. 1, each of the first traces 17A and each of the second traces 17B are connected to different potentials. Accordingly, an electric field is created between the first traces 17A and the second traces 17B. With the attenuation layer 19 being disposed between the first traces 17A and the second traces 17B as described above as one of the features of the first preferred embodiment, the electric field is applied not only to the piezoelectric layer 14 but also to the attenuation layer 19. As a result, the electric field applied to the piezoelectric layer 14 is attenuated, and the intensity of the unwanted bulk wave is reduced correspondingly. This leads to a reduction of ripples in the frequency characteristics.

The following describes the first preferred embodiment in more detail.

As mentioned above, the IDT electrodes 11 each include a pair of busbars. Each of the first traces 17A is electrically connected to one of the busbars of the corresponding one of the IDT electrodes 11. Each of the second traces 17B is electrically connected to the other busbar of the corresponding one of the IDT electrodes 11. Thus, each of the first traces 17A and each of the second traces 17B are connected to different potentials. It is preferred that the first traces 17A or the second traces 17B be connected to the HOT potential. The first traces 17A and the second traces 17B may all be connected to the HOT potential, or the first traces 17A or the second traces 17B may be connected to the GND potential instead of being connected to the HOT potential. It is not required that the second traces 17B be connected to the IDT electrode 11 connected with the respective first traces 17A. The second traces 17B may be connected to elements other than the IDT electrodes 11.

The attenuation layer 19 is disposed between two IDT electrodes 11. More specifically, the attenuation layer 19 is disposed between the first trace 17A connected to one of the busbars of one of the IDT electrodes 11 and the second trace 17B connected to one of the busbars of the other IDT electrode 11. The first trace 17A and the second trace 17B concerned are connected to different potentials.

Alternatively, the attenuation layer 19 may be disposed between the first trace 17A and the second trace 17B that are connected to the respective busbars of the same IDT electrode 11. An unwanted bulk wave signal can possibly propagate and be picked up between the first trace 17A and the second trace 17B that are connected to the respective busbars of the same IDT electrode 11. The aforementioned effect can be produced by the attenuation layer 19 disposed as described above. That is, the intensity of the unwanted bulk wave is reduced. This leads to a reduction of ripples in the frequency characteristics.

The following describes preferred features of the first preferred embodiment.

As illustrated in FIG. 1, the attenuation layer 19 preferably extends over an entirety of the region between the first trace 17A and the second trace 17B when viewed in plan. This feature effectively leads to a reduction of ripples in the frequency characteristics.

It is preferred that the region between the first trace 17A and the second trace 17B viewed in plan be at least partially covered with the attenuation layer 19. The attenuation layer 19 may cover at least a portion of the first trace 17A or at least a portion of the second trace 17B.

The Q factor of the attenuation layer 19 is preferably lower than the Q factor of the piezoelectric layer. For example, the attenuation layer 19 is preferably made of resin, such as polyimide. This feature effectively leads to a reduction of ripples in the frequency characteristics. Alternatively, the attenuation layer 19 may be made of an inorganic dielectric material. The expression "made of a specific material" herein implies that impurities may be present in an amount that is small enough not to cause deterioration of the electrical characteristics of the acoustic wave device.

Figure 4:
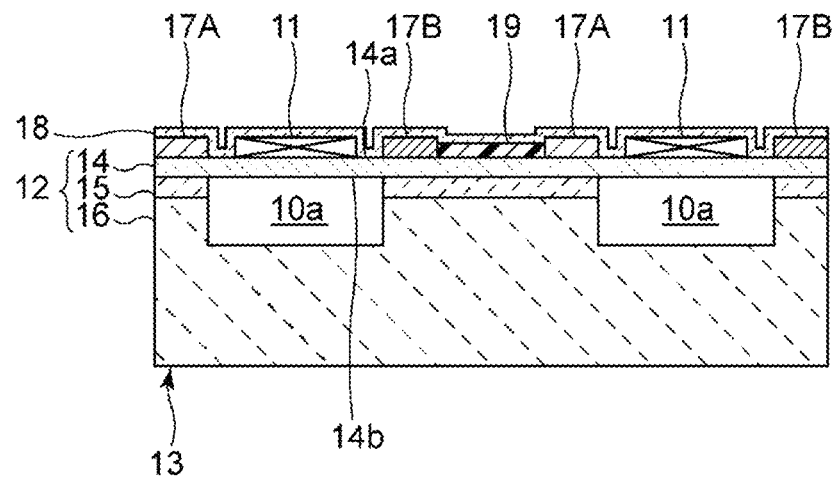
FIG. 4 is a sectional view of a modification of the acoustic wave device according to the first preferred embodiment of the present invention, schematically illustrating the acoustic wave device viewed from the front.

The piezoelectric substrate 12 may be overlaid with a protective film. A modification of the first preferred embodiment is illustrated in FIG. 4, in which the IDT electrodes 11, the first traces 17A, and the second traces 17B on the piezoelectric substrate 12 are covered with a protective film 18. Thus, the IDT electrodes 11, the first traces 17A, and the second traces 17B are less prone to breakage. The protective film 18 may be made of, for example, silicon oxide, silicon nitride, or silicon oxynitride. Using silicon oxide as the material of the protective film 18 enables an improvement in frequency-temperature characteristics. A film made of silicon nitride can define and function as both the protective film 18 and a frequency adjustment film.

The protective film 18 in this modification covers the attenuation layer 19. That is, the attenuation layer 19 is thus located between the piezoelectric layer 14 and the protective film 18. It is preferred that the IDT electrodes 11, the first traces 17A, and the second traces 17B each be at least partially covered with the protective film 18.

The IDT electrodes 11 in the first preferred embodiment are disposed on the first main surface 14a of the piezoelectric layer 14. In some preferred embodiments, however, the IDT electrodes 11 are disposed on the second main surface 14b of the piezoelectric layer 14. For example, the IDT electrodes 11 in such a preferred embodiment are located in the cavities 10a. The IDT electrodes 11 may be connected to the first traces 17A by through-via electrodes extending through the piezoelectric layer 14. The IDT electrodes 11 may also be connected to the second traces 17B by through-via electrodes.

Figure 5:
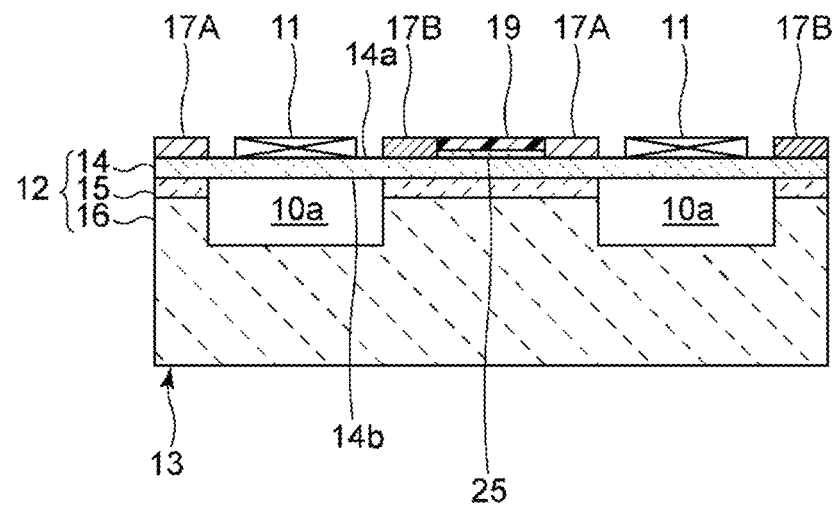
FIG. 5 is a sectional view of an acoustic wave device according to a second preferred embodiment of the present invention, schematically illustrating the acoustic wave device viewed from the front.

FIG. 5 is a sectional view of an acoustic wave device according to a second preferred embodiment, schematically illustrating the acoustic wave device viewed from the front.

The present preferred embodiment differs from the first preferred embodiment in that an interlayer 25 is disposed between the piezoelectric layer 14 and the attenuation layer 19. The acoustic wave device in the present preferred embodiment is otherwise structurally identical to the acoustic wave device 10 according to the first preferred embodiment.

The acoustic impedance of the interlayer 25 is within the range between the acoustic impedance of the piezoelectric layer 14 and the acoustic impedance of the attenuation layer 19. The interlayer 25 may be made of a dielectric material, such as silicon oxide.

The present preferred embodiment includes the following unique features. The acoustic impedance of the piezoelectric layer 14 is higher than the acoustic impedance of the interlayer 25, and the acoustic impedance of the interlayer 25 is higher than the acoustic impedance of the attenuation layer 19. In some preferred embodiments, however, the acoustic impedance of the piezoelectric layer 14 is lower than the acoustic impedance of the interlayer 25, and the acoustic impedance of the interlayer 25 is closer than the acoustic impedance of the attenuation layer 19.

Owing to the interlayer 25, an unwanted bulk wave propagating through the piezoelectric layer 14 can be effectively attenuated in the present preferred embodiment. This effect is described below in relation to the first preferred embodiment with reference to FIGS. 6A and 6B.

Figure 6A:
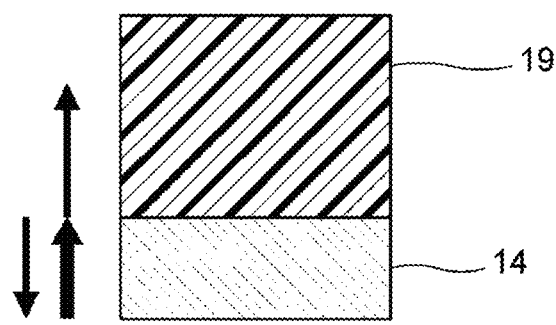
FIG. 6A is a schematic diagram for explanation of the propagation of an unwanted bulk wave in the first preferred embodiment of the present invention.
Figure 6B:
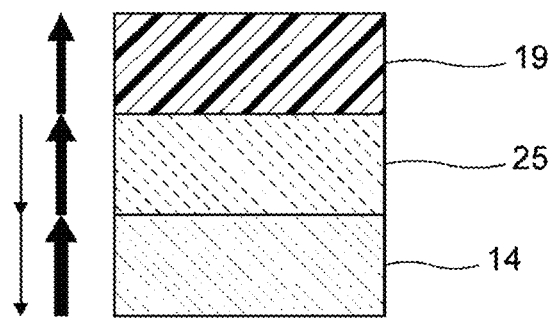
FIG. 6B is a schematic diagram for explanation of the propagation of an unwanted bulk wave in the second preferred embodiment of the present invention.
Figure 7A:
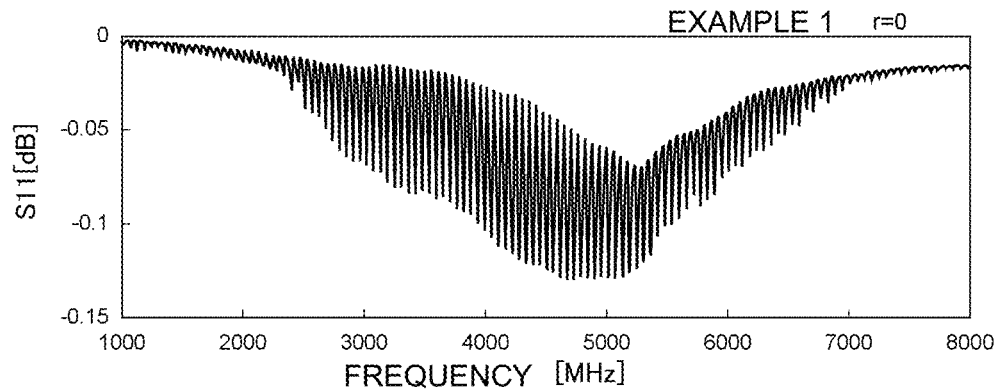
FIGS. 7A to 7D illustrate reflection characteristics exhibited in Examples 1 to 4 of the present invention.
Figure 7B:
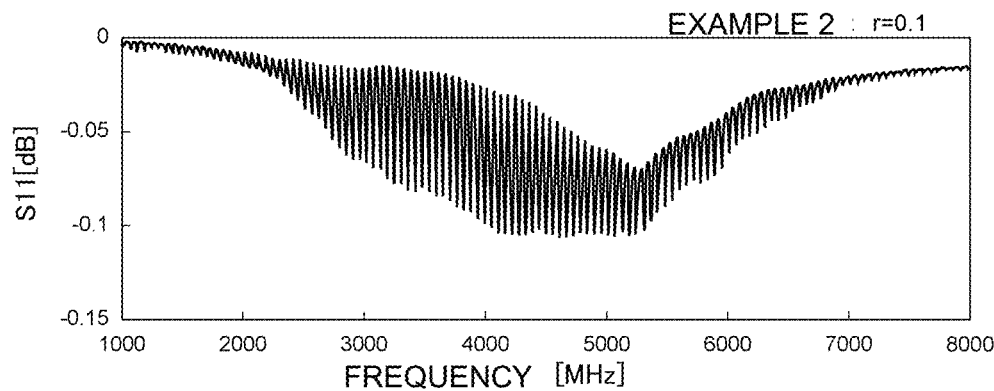
Figure 7C:
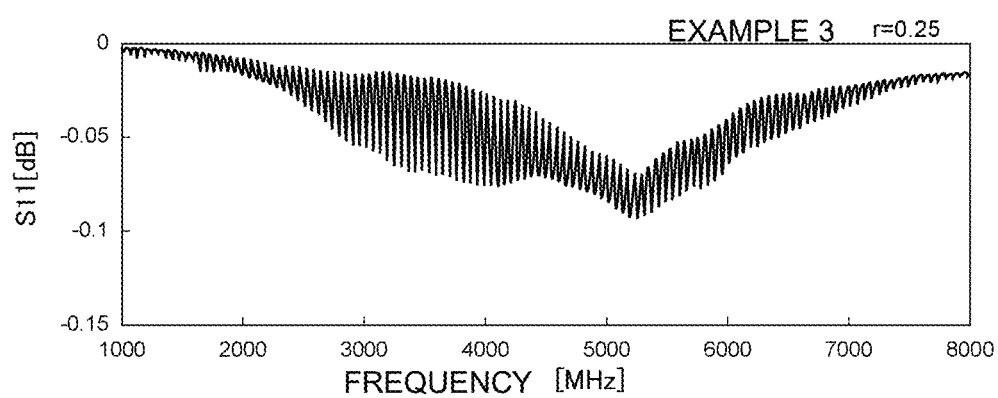
Figure 7D:
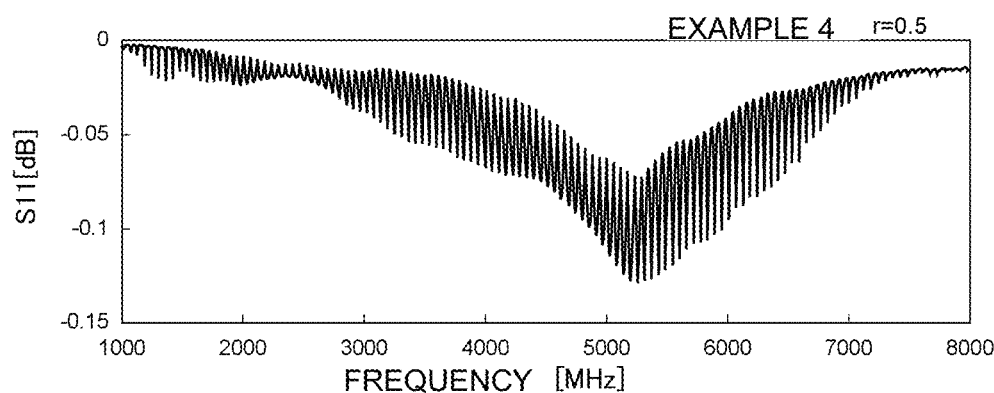

FIG. 6A is a schematic diagram for explanation of the propagation of an unwanted bulk wave in the first preferred embodiment. FIG. 6B is a schematic diagram for explanation of the propagation of an unwanted bulk wave in the second preferred embodiment.

As illustrated in FIG. 6A, the attenuation layer 19 in the first preferred embodiment is disposed directly on the piezoelectric layer 14. An unwanted bulk wave propagating through the piezoelectric layer 14 toward the attenuation layer 19 is partially reflected off the interface between the piezoelectric layer 14 and the attenuation layer 19 and back to the piezoelectric layer 14. The unreflected portion of the unwanted bulk wave from the piezoelectric layer 14 wave propagates through the attenuation layer 19.

As illustrated in FIG. 6B, the attenuation layer 19 in the second preferred embodiment is disposed over the piezoelectric layer 14 with the interlayer 25 located therebetween. As mentioned above, the acoustic impedance of the interlayer 25 is within the range between the acoustic impedance of the piezoelectric layer 14 and the acoustic impedance of the attenuation layer 19. Thus, there is little difference between the acoustic impedance of the piezoelectric layer 14 and the acoustic impedance of the interlayer 25. For this reason, an unwanted bulk wave bounces off the interface between the piezoelectric layer 14 and the interlayer 25 to a lesser extent. This means that a larger proportion of the unwanted bulk wave from the piezoelectric layer 14 can proceed into the interlayer 25.

The same holds true for the interlayer 25 and the attenuation layer 19. That is, there is little difference between the acoustic impedance of the interlayer 25 and the acoustic impedance of the attenuation layer 19. Thus, a larger proportion of the unwanted bulk wave from the interlayer 25 can proceed into the attenuation layer 19 without being trapped in the region close to the piezoelectric layer 14. As a result, the unwanted bulk wave propagating through the piezoelectric layer 14 can be effectively attenuated. This feature effectively leads to a reduction of ripples in the frequency characteristics.

The attenuation layer 19 preferably overlaps the first traces 17A and the second traces 17B when viewed in the direction in which each of the first traces 17A and the corresponding one of the second traces 17B face each other, as illustrated in FIG. 5. This layout leads effectively to a reduction in the intensity of the unwanted bulk wave.

The interlayer 25 is preferably thinner than each of the first traces 17A and each of the second traces 17B. This feature more reliably ensures that the attenuation layer 19 overlaps the first traces 17A and the second traces 17B when viewed in the direction in which each of the first traces 17A and the corresponding one of the second traces 17B face each other. Thus, the intensity of the unwanted bulk wave is reduced more reliably and effectively.

Only one interlayer 25 is provided in the second preferred embodiment. In some preferred embodiments, however, more than one interlayer 25 is provided. As mentioned above in relation to the second preferred embodiment, the acoustic impedance of the piezoelectric layer 14 is higher than the acoustic impedance of the attenuation layer 19. The interlayer 25 closer than the other interlayer(s) 25 to the piezoelectric layer 14 preferably has higher acoustic impedance. This feature ensures that an unwanted bulk wave bounces off the interface between the piezoelectric layer 14 and the attenuation layer 19 to a much lesser extent. As a result, the unwanted bulk wave propagating through the piezoelectric layer 14 can be further attenuated. This leads to a further reduction of ripples in the frequency characteristics.

In the case where the acoustic impedance of the piezoelectric layer 14 is lower than the acoustic impedance of the attenuation layer 19, the interlayer 25 closer than the other interlayer(s) 25 to the piezoelectric layer 14 preferably has lower acoustic impedance.

Adjusting the thickness of the interlayer 25 and the thickness of the attenuation layer 19 enables control of the frequency band for attenuation of unwanted bulk waves propagating through the piezoelectric layer 14 and the extent to which the unwanted waves are attenuated. The following elaborates on this effect.

The reflection characteristics between the first trace and the second trace of such an acoustic wave device were measured, as determined by varying the relative proportions of the thickness of the interlayer 25 and the thickness of the attenuation layer 19. Specifically, acoustic wave devices in Examples 1 to 4 were subjected to measurement of reflection characteristics. The proportion of the thickness of the attenuation layer 19 can be expressed as follows: r=tc/(tc+ta), where tc and ta represent the thickness of the interlayer 25 and the thickness of the attenuation layer 19, respectively.

In Example 1, r=0. As with the acoustic wave device in the first preferred embodiment, the acoustic wave device in Example 1 does not include the interlayer 25. In Example 2, r=0.1. In Example 3, r=0.25. In Example 4, r=0.5.

FIGS. 7A to 7D illustrate reflection characteristics exhibited in Examples 1 to 4.

As can be seen in FIGS. 7A to 7D, variations in the value of r caused differences in the intensity of ripples in the reflection characteristics and differences in the frequency at which the ripples were intensified. Given that the ripples arose from unwanted bulk waves, the results demonstrate that adjusting the thickness tc of the interlayer 25 and the thickness to of the attenuation layer 19 enables control of the frequency band for attenuation of unwanted bulk waves propagating through the piezoelectric layer 14 and the extent to which the unwanted waves are attenuated.

The acoustic wave resonator according to the first preferred embodiment and the acoustic wave resonator according to the second preferred embodiment are capable of using bulk waves in the thickness-shear mode, such as the first-order thickness-shear mode. The acoustic wave resonators may be capable of using plate waves or may be of the type that are capable of using bulk waves other than bulk waves in the thickness-shear mode. The following describes an example in which the acoustic wave resonators are bulk acoustic wave (BAW) elements.

Figure 8:
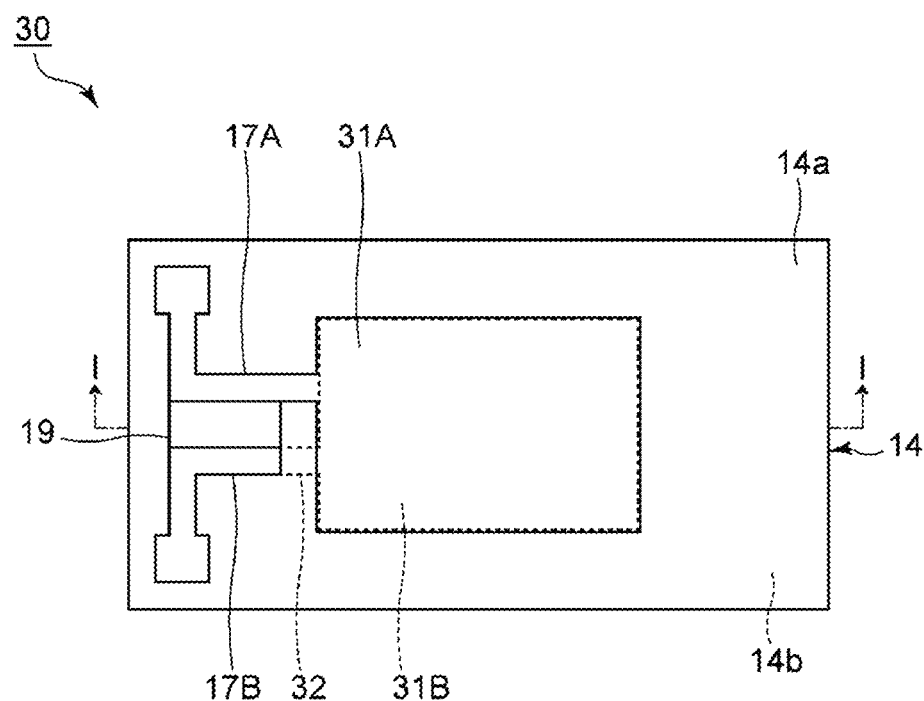
FIG. 8 is a plan view of an acoustic wave device according to a third preferred embodiment of the present invention.
Figure 9:
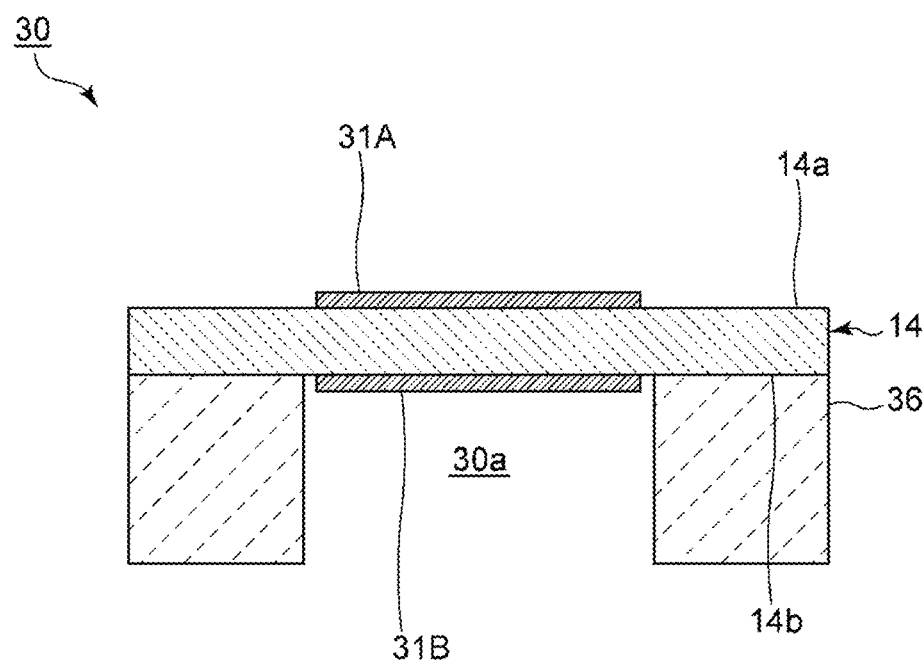
FIG. 9 is a sectional view of the acoustic wave device taken along line I-I in FIG. 8.

FIG. 8 is a plan view of an acoustic wave device according to a third preferred embodiment. FIG. 9 is a sectional view of the acoustic wave device taken along line I-I in FIG. 8.

Referring to FIGS. 8 and 9, an upper electrode 31A and a lower electrode 31B are included in a functional electrode of the acoustic wave device according to the present preferred embodiment. The upper electrode 31A is disposed on the first main surface 14a of the piezoelectric layer 14. The lower electrode 31B is disposed on the second main surface 14b of the piezoelectric layer 14. The upper electrode 31A and the lower electrode 31B are disposed on opposite sides with the piezoelectric layer 14 therebetween.

The upper electrode 31A and the lower electrode 31B are connected to different potentials. The region sandwiched between the upper electrode 31A and the lower electrode 31B is an excitation region. As illustrated in FIG. 9, the excitation region overlaps a cavity 30a when viewed in plan. Upon application of an alternating electric field between the upper electrode 31A and the lower electrode 31B, an acoustic wave is excited in the excitation region.

As illustrated in FIG. 8, the first traces 17A and the second traces 17B are disposed on the first main surface 14a of the piezoelectric layer 14. The first trace 17A is connected to the upper electrode 31A. The second trace 17B is electrically connected to the lower electrode 31B. More specifically, a connection electrode 32 is disposed on the second main surface 14b of the piezoelectric layer 14. The connection electrode 32 is connected to the lower electrode 31B. The piezoelectric layer 14 has a through-hole. The connection electrode 32 extends through the through-hole and is connected to the second trace 17B. That is, the second trace 17B is connected to the lower electrode 31B with the connection electrode 32 extending therebetween.

The present preferred embodiment is similar to the first preferred embodiment in the following respects. The attenuation layer 19 is located between the first trace 17A and the second trace 17B when viewed in plan. This layout reduces the degree to which the frequency characteristics are affected by unwanted bulk waves. The present preferred embodiment can thus reduce ripples in the frequency characteristics.

Referring to FIG. 9, the support includes a support substrate 36 only. As described above, the piezoelectric layer 14 in the first preferred embodiment is disposed over the support substrate 16 with the insulating layer 15 laid therebetween, whereas the piezoelectric layer 14 in the present preferred embodiment is disposed directly on the support substrate 36. The support substrate 36 has a through-hole, which is the cavity 30a.

The upper electrode 31A and the lower electrode 31B, which are excitation electrodes, may be covered with the protective film 18 (see FIG. 4) to make the upper electrode 31A and the lower electrode 31B less prone to breakage.

The thickness-shear mode and plate waves are described below in detail. The IDT electrode described below is a representative of the IDT electrodes 11 mentioned above. The term "electrodes" used below in relation to the IDT electrode corresponds to electrode fingers referred to in the appended claims. The term "support" in the following example corresponds to a support substrate referred to in the appended claims.

Figure 10A:
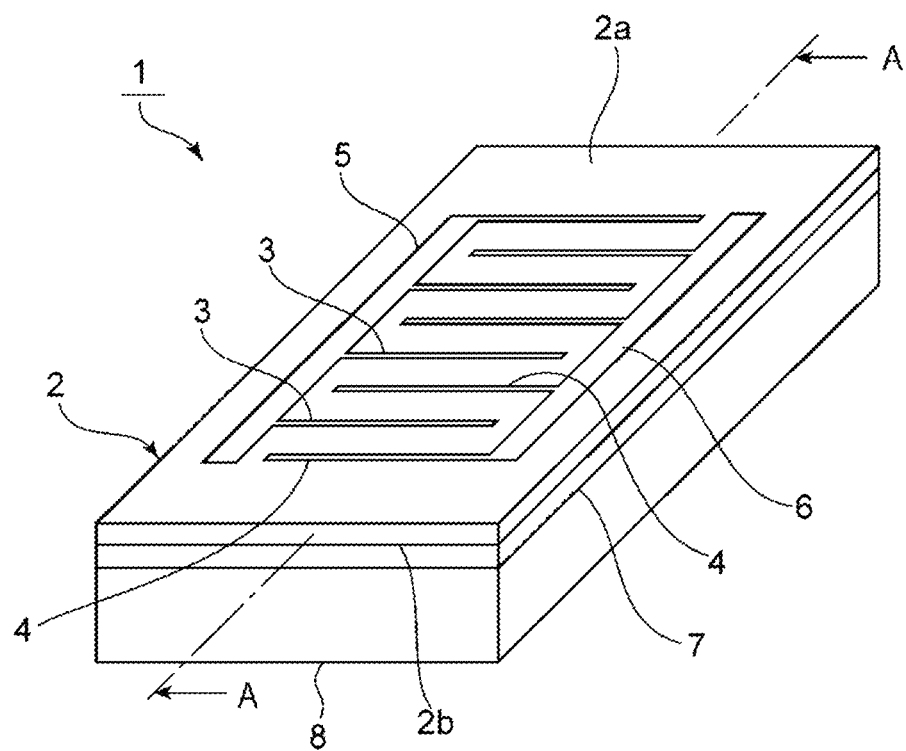
FIG. 10A is a schematic external perspective view of an acoustic wave device that uses bulk waves in the thickness-shear mode.
Figure 10B:
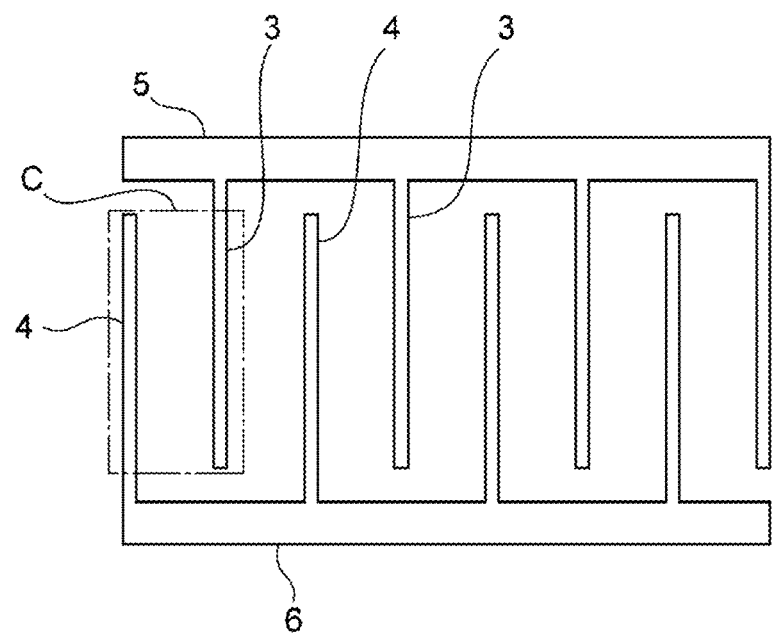
FIG. 10B illustrates the structure of electrodes on a piezoelectric substrate viewed in plan.
Figure 11:
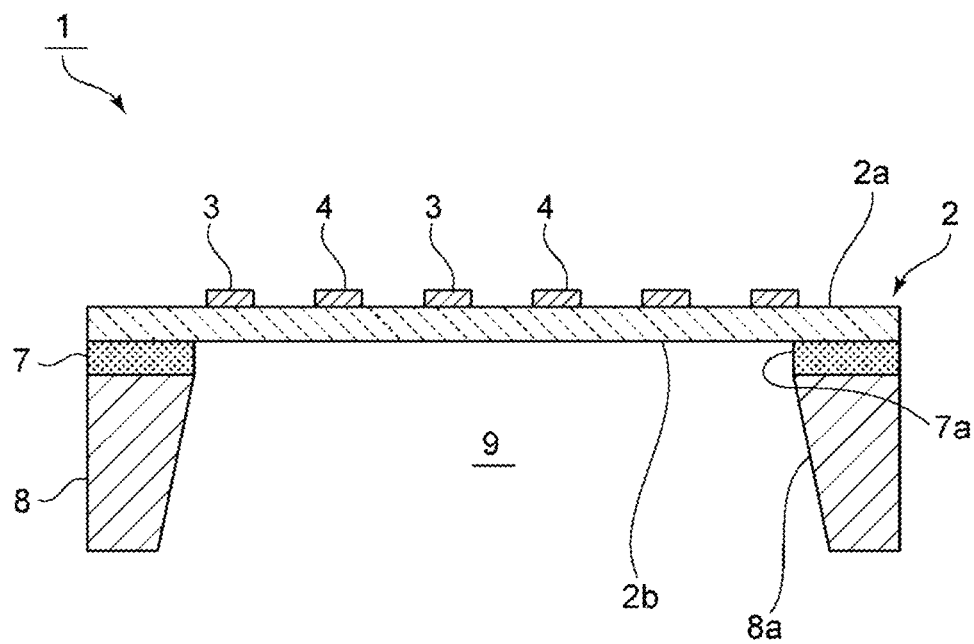
FIG. 11 is a sectional view of the acoustic wave device taken along line A-A in FIG. 10A.

FIG. 10A is a schematic external perspective view of an acoustic wave device that uses bulk waves in the thickness-shear mode. FIG. 10B illustrates the structure of electrodes on a piezoelectric substrate viewed in plan. FIG. 11 is a sectional view of the acoustic wave device taken along line A-A in FIG. 10A.

An acoustic wave device 1 includes a piezoelectric layer 2, which is made of $LiNbO_3$. Alternatively, the piezoelectric layer 2 may be made of $LiTaO_3$. Although the piezoelectric layer 2 is a Z-cut $LiNbO_3$ layer or a Z-cut $LiTaO_3$, the layer may be a rotated Y-cut $LiNbO_3$ layer, a rotated Y-cut $LiTaO_3$ layer, an X-cut $LiNbO_3$ layer, or an X-cut $LiTaO_3$ layer. The thickness of the piezoelectric layer 2 is not limited to a particular value. In light of effective excitation of the thickness-shear mode, the thickness of the piezoelectric layer 2 is preferably not less than about 40 nm and not more than about 1,000 nm and is more preferably not less than about 50 nm and not more than a about 1,000 nm, for example. The piezoelectric layer 2 includes a first main surface 2a and a second main surface 2b on opposite sides. Electrodes 3 and electrodes 4 are disposed on the first main surface 2a. Each of the electrodes 3 is an example of a first electrode finger, and each of the electrodes 4 is an example of a second electrode finger. Referring to FIGS. 10A and 10B, the electrodes 3 are connected to a first busbar 5, and the electrodes 4 are connected to a second busbar 6. The electrodes 3 interdigitate with the electrodes 4. The electrodes 3 and the electrodes 4 are each rectangular in shape and have a longitudinal direction. Each of the electrodes 3 and the electrode 4 adjacent thereto face each other in a direction orthogonal to the longitudinal direction. The longitudinal direction of the electrodes 3 and 4 and the direction orthogonal to the longitudinal direction of the electrodes 3 and 4 each form an angle with the thickness direction of the piezoelectric layer 2. Each of the electrodes 3 and the electrode 4 adjacent thereto may thus be regarded as facing each other in a direction that forms an angle with the thickness direction of the piezoelectric layer 2. In some preferred embodiments, however, the direction orthogonal to the longitudinal direction of the electrodes 3 and 4 illustrated in FIGS. 10A and 10B may be designated as the longitudinal direction of the electrodes 3 and 4. That is, the electrodes 3 and 4 may extend in the longitudinal direction of the first busbar 5 and the second busbar 6 illustrated in FIGS. 10A and 10B. In this case, the first busbar 5 and the second busbar 6 extend in the longitudinal direction of the electrodes 3 and 4 illustrated in FIGS. 10A and 10B. The electrodes 3 connected to one potential and the electrodes 4 connected to the other potential are arranged in pairs, and each pair of electrodes or, more specifically, adjacent ones of the electrodes are located side by side in the direction orthogonal to the longitudinal direction of the electrodes 3 and 4. Each of the electrodes 3 and the electrode 4 adjacent thereto are not in direct contact with each other and are disposed with a space therebetween. Each of the electrodes 3 and the electrode 4 adjacent thereto are arranged with no other electrodes therebetween. That is, neither the other electrodes 3 and 4 nor other electrodes connected to the HOT electrode or the ground electrode are disposed between the adjacent ones of the electrodes 3 and 4. It is not required that the number of pairs be an integer. For example, the number of pairs may be 1.5 or 2.5. The center-to-center distance of the adjacent ones of the electrodes 3 and 4 is herein referred to as pitch and is preferably not less than about 1 μm and not more than about 10 μm, for example. The width of each of the electrodes 3 and 4, that is, the dimension of each of the electrodes 3 and 4 in the direction in which adjacent ones of the electrodes 3 and 4 face each other is preferably not less than about 50 nm and not more than about 1,000 nm and is more preferably not less than about 150 nm and not more than about 1,000 nm, for example. The center-to-center distance between the electrodes 3 and 4 adjacent to each other is the distance between the midpoint of the dimension (width) of the electrode 3 in the direction orthogonal to the longitudinal direction of the electrode 3 and the midpoint of the dimension (width) of the electrode 4 in the direction orthogonal to the longitudinal direction of the electrode 4.

With a Z-cut piezoelectric layer being included as the piezoelectric layer 2 in the acoustic wave device 1, the direction orthogonal to the longitudinal direction of the electrodes 3 and 4 is orthogonal to the polarization direction of the piezoelectric layer 2, except where the piezoelectric layer 2 is made of a piezoelectric material having any other cut-angle. The term "orthogonal" herein does not necessarily mean the orthogonality in a strict sense and may also mean the substantial orthogonality. For example, the angle the direction orthogonal to the longitudinal direction of the electrodes 3 and 4 defines with the polarization direction may be about 90° with a margin of error of plus or minus about 10°, for example.

A support 8 is disposed over the second main surface 2b of the piezoelectric layer 2 with an insulating layer 7 laid between the support 8 and the second main surface 2b. The insulating layer 7 and the support 8 are each in the form of a frame and has a through-hole 7a and a through-hole 8a (see FIG. 11), respectively. The through-hole 7a and the through-hole 8a define a cavity 9. The cavity 9 is intended to eliminate or reduce the possibility that vibrations of an excitation region C of the piezoelectric layer 2 will be hampered. With this in view, the support 8 disposed over the second main surface 2b with the insulating layer 7 laid therebetween does not extend over at least one of the pairs of electrodes, each pair including one electrode 3 and one electrode 4. The insulating layer 7 is optional. This means that the support 8 may be disposed directly on the second main surface 2b of the piezoelectric layer 2 or may be disposed over piezoelectric layer 2 without direct contact with the second main surface 2b.

The insulating layer 7 is made of silicon oxide. Alternatively, the insulating layer 7 may be made of a suitable insulating material, such as silicon oxynitride or alumina. The support 8 is made of silicon (Si). One of the surfaces that is closer than the other surface of the Si layer to the piezoelectric layer 2 may be a (100) plane, a (110) plane, or a (111) plane. The support 8 is preferably made of high-resistance silicon having a resistivity of about 4 kQcm or more, for example. The support 8 may be made of a suitable insulating material or a suitable semiconducting material.

Examples of the material of the support 8 include: piezoelectric materials such as aluminum oxide, lithium tantalate, lithium niobate, and quarts; various kinds of ceramics such as alumina, magnesia, sapphire, silicon nitride, aluminum nitride, silicon carbide, zirconia, cordierite, mullite, steatite, and forsterite; dielectric materials such as diamond and glass; and semiconducting materials such as gallium nitride.

The electrodes 3, the electrodes 4, the first busbar 5, and the second busbar 6 are made of a suitable metal such as Al or a suitable alloy such as an alloy of Al and Cu. The electrodes 3, the electrodes 4, the first busbar 5, and the second busbar 6 in the present preferred embodiment each include a Ti film and an Al film stacked on the Ti film. The electrodes and the busbars each may include an adhesive layer other than the Ti film.

The acoustic wave device is driven by the application of an alternating voltage between the array of the electrodes 3 and the array of the electrodes 4. More specifically, an alternating voltage is applied between the first busbar 5 and the second busbar 6. As a result, bulk waves in the thickness-shear mode are excited when propagating through the piezoelectric layer 2. Accordingly, the acoustic wave device can exhibit the resonance characteristics attributable to the bulk waves. The acoustic wave device 1 is designed to ensure that d/p is less than or equal to about 0.5, for example, where d represents the thickness of the piezoelectric layer 2, and p represents the center-to-center distance of any one of the pairs of electrodes, each pair including one electrode 3 and one electrode 4 that are adjacent to each other. The bulk waves in the thickness-shear mode are thus excited effectively, and as a result, favorable resonance characteristics are exhibited. It is preferable that d/p be less than or equal to about 0.24, for example. Accordingly, more favorable resonance characteristics will be exhibited.

With the acoustic wave device 1 being configured as described above, the number of electrode pairs each including one electrode 3 and one electrode 4 may be reduced for miniaturization of the acoustic wave device 1 without a significant decrease in Q factor. The reason is that a reduction in the number of electrode fingers of the reflectors disposed on opposite sides can be reduced with little propagation loss. The number of electrode fingers of the reflectors may be reduced in a case where the acoustic wave device is configured to use bulk waves in the thickness-shear mode. The following describes, with reference to FIGS. 12A and 12B, points of difference between a Lamb wave used in an acoustic wave device and a bulk wave in the thickness-shear mode mentioned above.

Figure 12A:
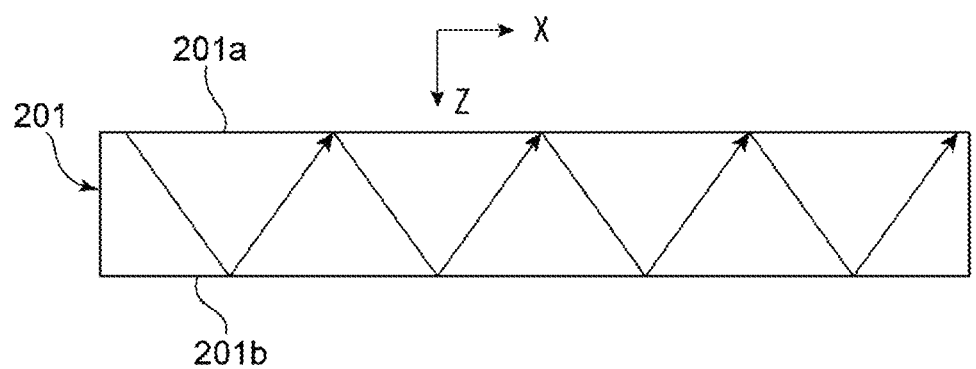
FIG. 12A is a schematic diagram for explanation of the propagation of a Lamb wave, illustrating the Lam wave propagating through a piezoelectric film of an acoustic wave device viewed in section from the front.
Figure 12B:
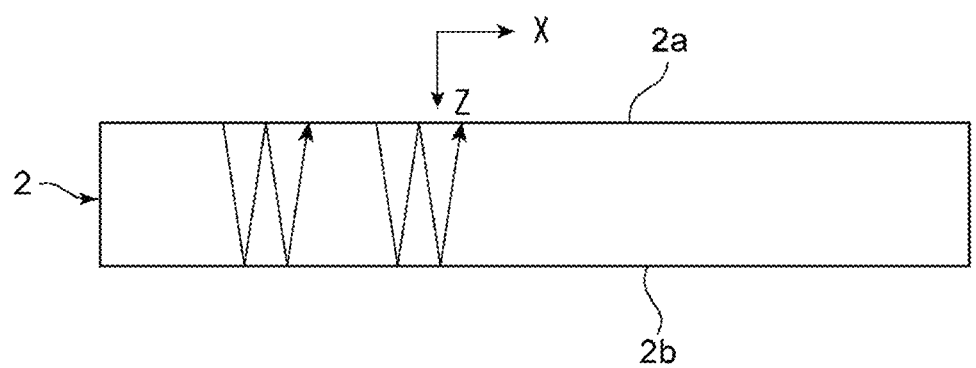
FIG. 12B is a schematic diagram for explanation of the propagation of a bulk wave in the thickness-shear mode, illustrating the bulk wave propagating through a piezoelectric film of an acoustic wave device viewed in section from the front.

FIG. 12A is a schematic diagram for explanation of the propagation of a Lamb wave in an acoustic wave device such as the one described in Japanese Unexamined Patent Application Publication No. 2012-257019, illustrating the Lam wave propagating through a piezoelectric film of the acoustic wave device viewed in section from the front.

Arrows in FIG. 12A denote a wave propagating through a piezoelectric film 201. The piezoelectric film 201 has a first main surface 201a and a second main surface 201b, which are located on opposite sides. The thickness direction or, more specifically, the direction of an imaginary line forming a connection between the first main surface 201a and the second main surface 201b is denoted by Z. The direction in which electrode fingers of an IDT electrode are arranged side by side is denoted by X. A Lamb wave propagates in the X direction as illustrated in FIG. 12A. Lamb waves are plate waves. Thus, the wave propagates in the X direction while the piezoelectric film 201 vibrates as a whole. The IDT electrode is disposed between reflectors on the respective sides in the X direction such that resonance characteristics are exhibited. This results in wave propagation loss. Accordingly, the Q factor would decrease if the number of electrode fingers is reduced for the purpose of miniaturization of the acoustic wave device Referring to FIG. 12B, the acoustic wave device 1 involves vibrational displacement in the thickness sheer direction such that a wave propagates mostly in the direction of an imaginary line forming a connection between the first main surface 2a and the second main surface 2b of the piezoelectric layer 2, that is, in the Z direction, and as a result, resonance occurs. The X-direction component of the wave is thus much smaller than the Z-direction component of the wave. As the wave propagates in the Z direction, resonance characteristics are exhibited. The number of electrode fingers included in each reflector can thus be reduced with little propagation loss. For further miniaturization, the number of electrode pairs each including one electrode 3 and one electrode 4 can be reduced without a significant decrease in Q factor.

Figure 13:
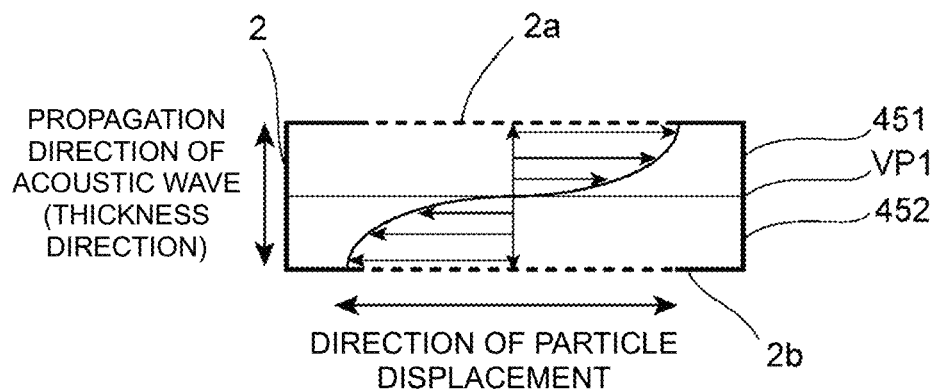
FIG. 13 illustrates the direction of the amplitude of a bulk wave in the thickness-shear mode.

Referring to FIG. 13, the amplitude of a bulk wave in the thickness-shear mode in a first region 451 within the excitation region C of the piezoelectric layer 2 is opposite in direction to the amplitude of the bulk wave in a second region 452 within the excitation region C of the piezoelectric layer 2. FIG. 13 schematically illustrates a bulk wave for the case in which a voltage is applied between an array of the electrodes 3 and an array of the electrodes 4 in such a manner that the electrodes 4 are at a higher potential than the electrode 3. The first region 451 is a portion of the excitation region C and extends between the first main surface 2a and an imaginary plane VP1, which is orthogonal to the thickness direction of the piezoelectric layer 2 and divides the piezoelectric layer 2 into two halves. The second region 452 is a portion of the excitation region C and extends between the second main surface 2b and the imaginary plane VP1.

As mentioned above, the acoustic wave device 1 includes one or more pairs of electrodes, each the pair including one electrode 3 and one electrode 4. These electrodes do not cause a wave to propagate in the X direction. For this reason, it is not required that the number of electrode pairs be greater than one. In other words, it is preferred that at least one electrode pair be included.

For example, the electrodes 3 are connected to the HOT potential, and the electrodes 4 are connected to the GND potential. Alternatively, the electrodes 3 may be connected to the GND potential, and the electrodes 4 may be connected to the HOT potential. As mentioned above, each electrode of the at least one pair of electrodes is connected to the HOT potential or the GND potential. That is, the acoustic wave device according to the present preferred embodiment includes no floating electrode.

Figure 14:
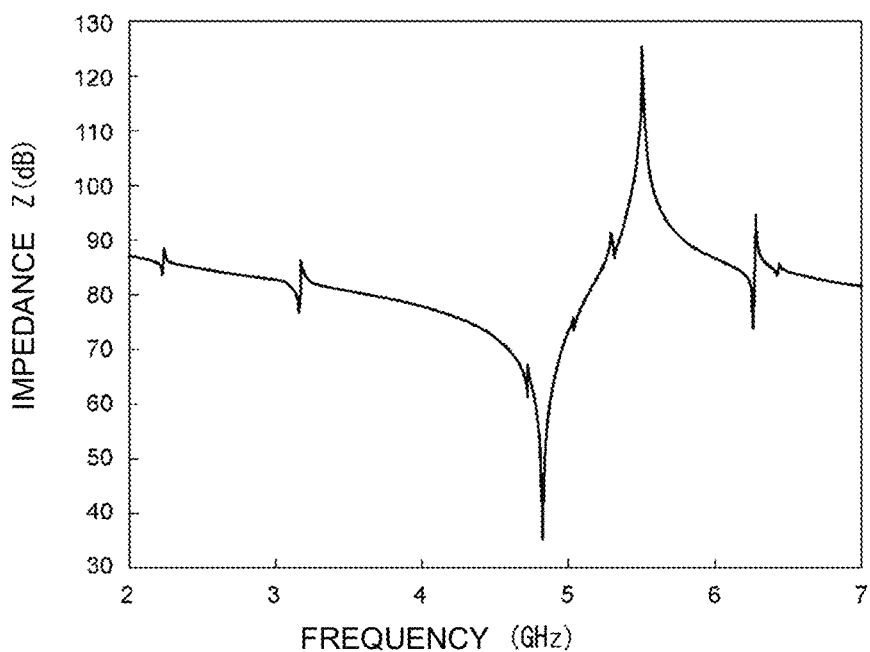
FIG. 14 illustrates the resonance characteristics of the acoustic wave device that uses bulk waves in the thickness-shear mode.

FIG. 14 illustrates the resonance characteristics of the acoustic wave device illustrated in FIG. 11. The design parameters of an example of the acoustic wave device 1 capable of exhibiting the resonance characteristics are as follows.

Piezoelectric Layer 2: a LiNbO$_3$ layer with the Euler angles (0°, 0°, 90°) and a thickness of 400 nm Electrodes 3 and 4: the length of the excitation region C (an overlap between one electrode 3 and one electrode 4 viewed in the direction orthogonal to the longitudinal direction of the electrodes 3 and 4)=40 μm; the number of electrode pairs (each including one electrode 3 and one electrode 4)=21; the center-to-center distance of each electrode pair=3 μm; the width of each electrode=500 nm; d/p=0.133

Insulating Layer 7: a silicon oxide film with a thickness of 1 μm

Support 8: Si

The length of the excitation region C is the dimension of the excitation region C in the longitudinal direction of the electrodes 3 and 4.

All of the pairs of electrodes (each pair including one electrode 3 and one electrode 4) in the present preferred embodiment are arranged with the same electrode-to-electrode distance. That is, the electrodes 3 and 4 are arranged with a constant pitch.

As is clear from FIG. 14, the acoustic wave device can exhibit favorable resonance characteristics with a fractional bandwidth of about 12.5%, for example, without having to include reflectors.

As mentioned above, d/p in the present preferred embodiment is less than or equal to about 0.5 and is preferably less than or equal to about 0.24, for example, where d represents the thickness of the piezoelectric layer 2, and p represents the center-to-center distance of the pairs of electrodes, each pair including one electrode 3 and one electrode 4. The following elaborates on this point with reference to FIG. 15.

Figure 15:
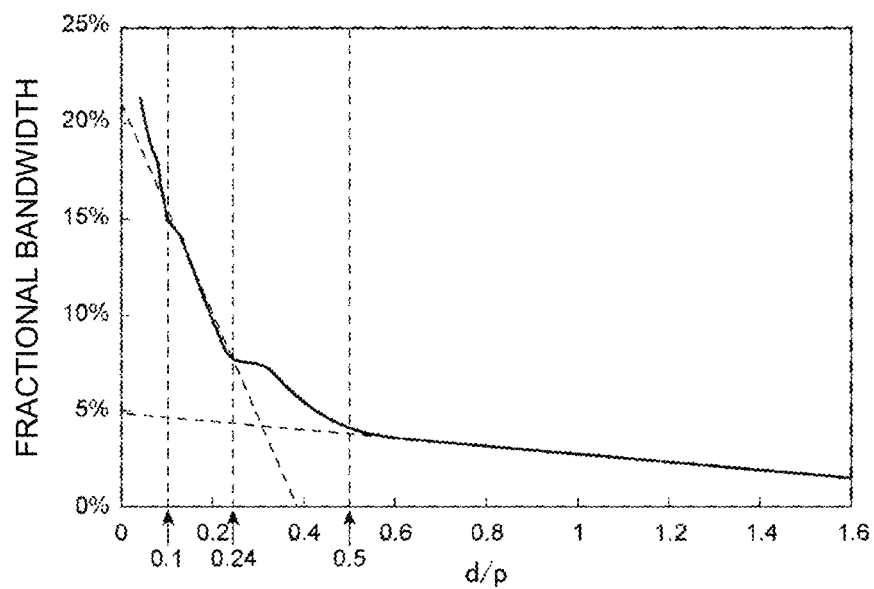
FIG. 15 illustrates the relationship between d/p and the fractional bandwidth of an acoustic wave device functioning as a resonator, where p represents the center-to-center distance of adjacent electrodes, and d represents the thickness of the piezoelectric layer of the acoustic wave device.

The following description concerns different acoustic wave devices with different values of d/p. All of the acoustic wave devices are capable of exhibiting the resonance characteristics illustrated in FIG. 14. FIG. 15 illustrates the relationship between d/p and the fractional bandwidth of each of the acoustic wave devices functioning as resonators.

As is clear from FIG. 15, the fractional bandwidth for the case in which d/p>about 0.5 is less than about 5%, for example, irrespective of variations in d/p. Meanwhile, d/p may be adjusted in such a manner that the fractional bandwidth for the case in which d/p about 0.5 becomes greater than or equal to about 5%, for example. Accordingly, a resonator with a higher coupling coefficient can be provided. The fractional bandwidth for the case in which d/p about 0.24 is greater than or equal to about 7%, for example. Furthermore, d/p may be adjusted in such a manner that the fractional bandwidth for the case in which d/p about 0.24 becomes much broader. Accordingly, a resonator with a much higher coupling coefficient can be provided. The results concerning resonators that use bulk waves in the thickness-shear mode demonstrate that the coupling coefficient of such a resonator with a d/p of about 0.5 or less, for example, is relatively high.

Figure 16:
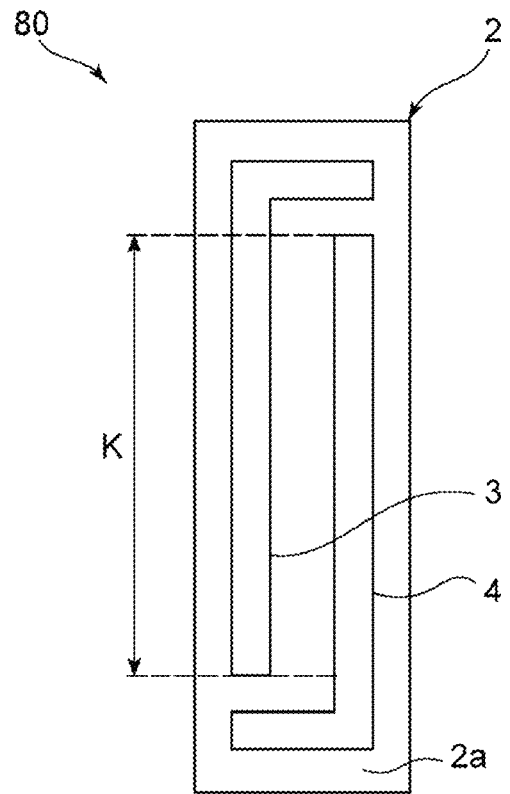
FIG. 16 is a plan view of an acoustic wave device that uses bulk waves in the thickness-shear mode.

FIG. 16 is a plan view of an acoustic wave device that uses bulk waves in the thickness-shear mode. The acoustic wave device, which is denoted by 80, includes a pair of electrodes, namely, one electrode 3 and one electrode 4. The pair of electrodes is disposed on the first main surface 2a of the piezoelectric layer 2. The cross width of the electrodes are denoted by K in FIG. 16. As mentioned above, an acoustic wave device according to a preferred embodiment of the present invention may include one pair of electrodes.

When d/p is less than or equal to about 0.5, for example, bulk waves in the thickness-shear mode can be effectively excited.

Figure 17:
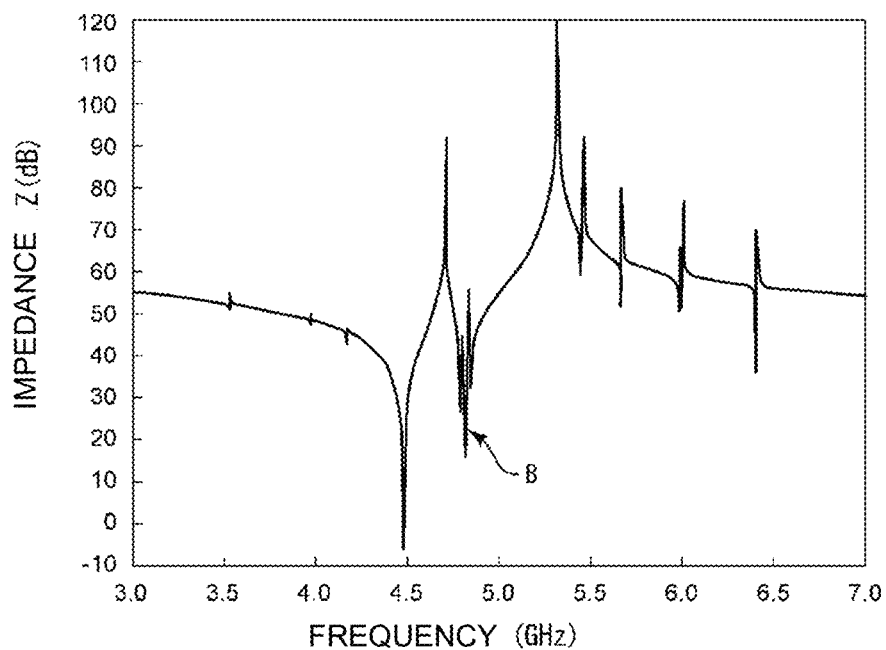
FIG. 17 illustrates the resonance characteristics of an acoustic wave device in a reference example in which a spurious emission is detected.

The acoustic wave device 1 is preferably configured in such a manner that the inequality MR≤about 1.75(d/p)+ 0.075 is satisfied, for example, where the metallization ratio MR is the ratio of the area of any one of the pairs of electrodes to the area of the excitation region C. With each pair of electrodes including one electrode 3 and one electrode 4 that are adjacent to each other, the electrodes 3 and 4 overlap each other in the excitation region C when viewed in the direction in which adjacent ones of the electrodes 3 and 4 face each other. This feature leads effectively to a reduction in spurious emission. The following elaborates on this point with reference to FIGS. 17 and 18. The resonance characteristics of the acoustic wave device 1 are illustrated in FIG. 17 by way of example for reference. As indicated by an arrow B, a spurious emission is found between the resonant frequency and anti-resonant frequency. FIG. 17 illustrates the resonance characteristics for the case in which d/p=about 0.08, for example. The acoustic wave device in this example includes a LiNbO$_3$ layer with the Euler angles (0°, 0°, The metallization ratio in this example is about 0.35 (MR=0.35), for example.

The metallization ratio MR is described below with reference to FIG. 10B. FIG. 10B illustrates multiple pairs of electrodes, each pair including one electrode 3 and one electrode 4. However, the following focuses solely on one pair of electrodes assuming that there are no other pairs of electrodes. The excitation region C in this example is enclosed with a dash-dot line. The excitation region C includes a region that is a portion of the electrode 3 and being an overlap between the electrodes 3 and 4 viewed in the direction orthogonal to the longitudinal direction of the electrodes 3 and 4, that is, in the direction in which the electrodes 3 and 4 face each other, a region that is a portion of the electrode 4 and being an overlap between the electrode 3 and 4 viewed in the direction concerned, and a region that is an overlap area between the electrodes 3 and 4 and extending between the electrodes 3 and 4. The metallization ratio MR is the ratio of the sum of the areas of the electrodes 3 and 4 in the excitation region C to the area of the excitation region C. That is, the metallization ratio MR is the proportion of the area of the metallized portion in the area of the excitation region C.

The metallization ratio MR for the case in which more than one pair of electrodes are disposed is determined by dividing the sum of the areas of metallized portions in all excitation regions by the sum of the areas of the excitation regions.

Figure 18:
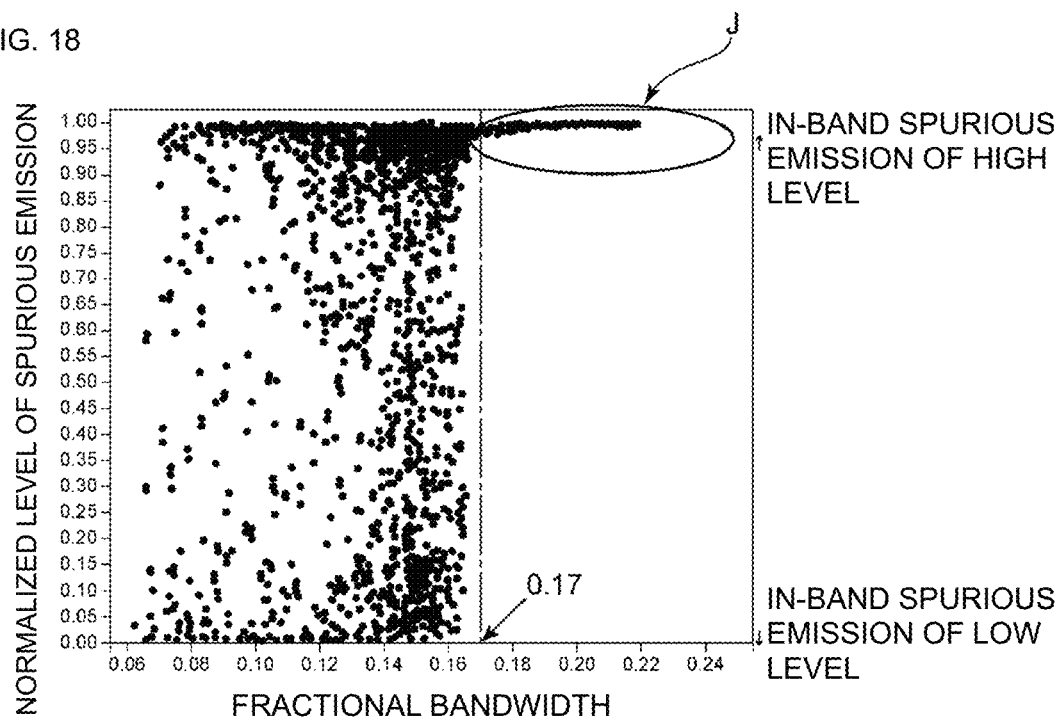
FIG. 18 illustrates the relationship between the functional bandwidth and the amount of impedance phase rotation normalized to within 180 degrees as the level of spurious emission.

FIG. 18 illustrates the relationship between the fractional bandwidth obtained by many acoustic wave resonators arranged as described above in relation to the present preferred embodiment and the amount of impedance phase rotation normalized to within 180 degrees as the level of spurious emission. Measurements were conducted for various fractional bandwidths obtained by varying the thickness of the piezoelectric layer and the dimensions of the electrodes. Although the piezoelectric layer concerned in FIG. 18 is a Z-cut LiNbO$_3$ layer, a piezoelectric layer having any other cut-angle will exhibit similar characteristics.

The spurious level in the region indicated by an ellipse J in FIG. 18 is as high as 1.0. As is clear from FIG. 18, spurious emissions at a level of one or higher are detected in the passband when the fractional bandwidth exceeds about 0.17 (about 17%), for example, irrespective of variations in parameters that are the determinants of the fractional bandwidth. This means that in-band spurious emissions of high level, such as the one indicated by the arrow B relevant to the resonance characteristics illustrated in FIG. 17, are detected. Thus, the fractional bandwidth is preferably less than or equal to about 17%, for example. Adjusting the thickness of the piezoelectric layer 2 and the dimensions of the electrodes 3 and 4 enables a reduction in spurious emission.

Figure 19:
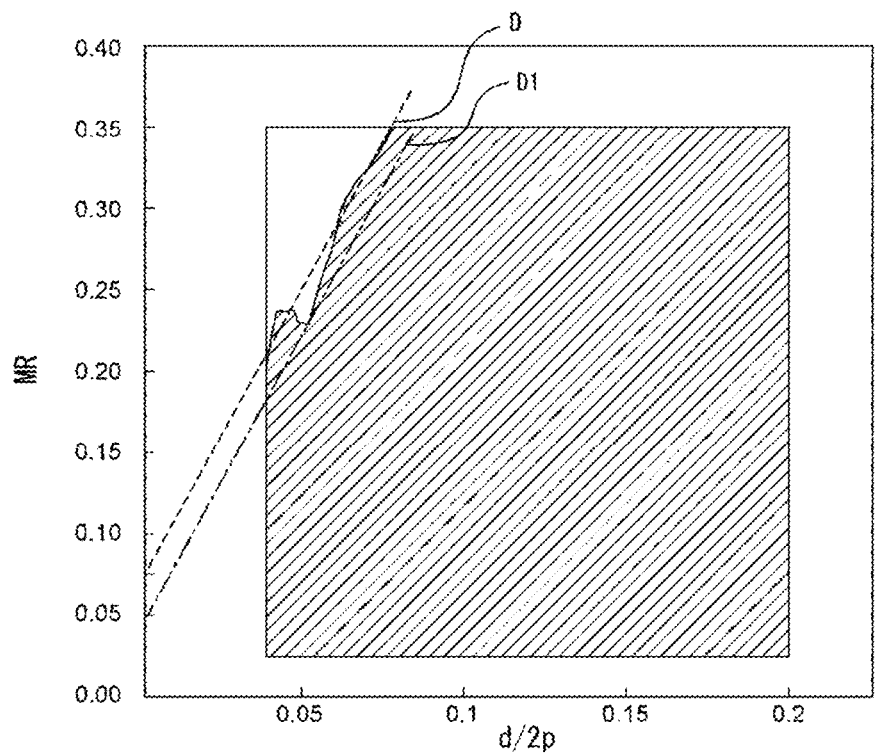
FIG. 19 illustrates the relationship between d/2p and the metallization ratio MR.

FIG. 19 illustrates the relationship among d/2p, the metallization ratio MR, and the fractional bandwidth. Acoustic wave devices varying in d/2p and MR were configured as described above and subjected to measurement of fractional bandwidth. The hatched area on the right of a broken line D in FIG. 19 is a region in which the fractional bandwidth was lower than or equal to about 17%, for example. The boundary between the hatched area and the area that is not hatched is expressed by the following equation: MR=about 3.5(d/2p)+0.075. This can be rewritten as follows: MR=about 1.75(d/p)+0.075. The inequality MR≤about 1.75(d/p)+0.075 preferably is satisfied. When the inequality is satisfied, it is easily ensured that the fractional bandwidth is less than or equal to about 17%, for example. The area on the right of a dash-dot line D1 in FIG. 19 is more preferred, where D1 is expressed by the following equation: MR=about 3.5(d/2p)+0.05, for example. When the inequality MR≤about 1.75(d/p)+0.05 is satisfied, it is reliably ensured that the fractional bandwidth is less than or equal to about 17%, for example.

Figure 20:
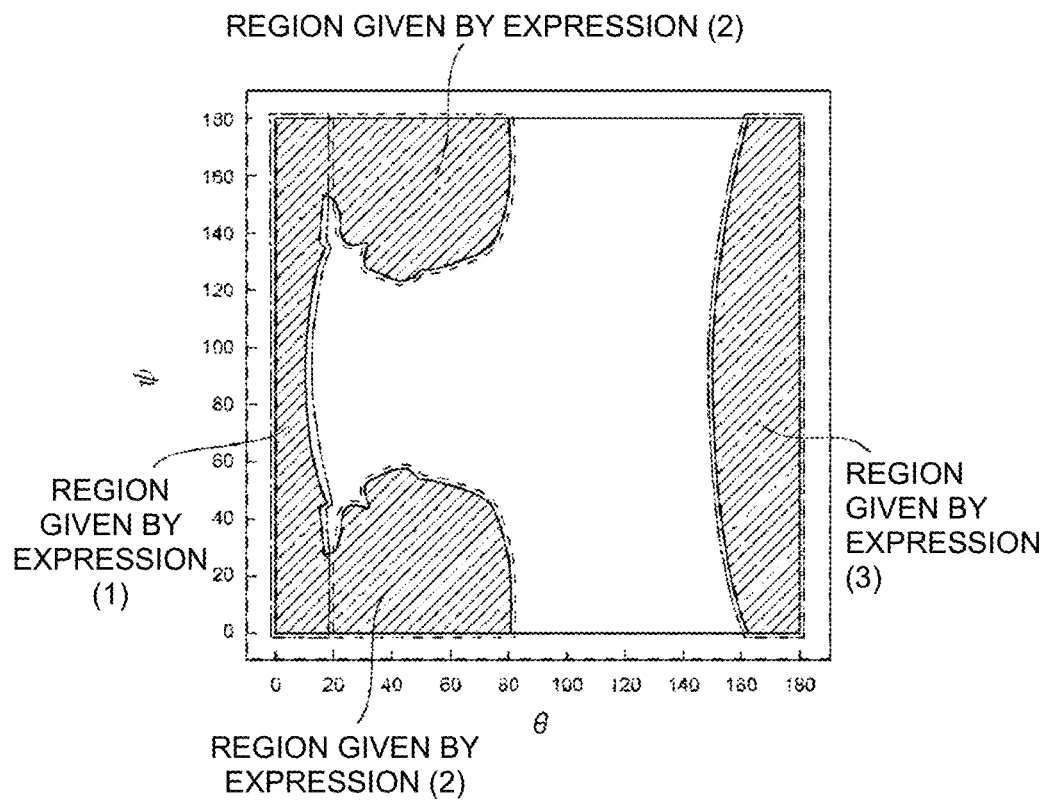
FIG. 20 is a map illustrating the fractional bandwidth with respect to the Euler angles (0°, θ, ψ) of $LiNbO_3$ in an example where d/p is infinitely close to zero.

FIG. 20 is a map illustrating the fractional bandwidth with respect to the Euler angles (0°, θ, ψ) of LiNbO$_3$ in an example where d/p is infinitely close to zero. Hatched areas in FIG. 20 are regions in which the fractional bandwidth was not less than about 5%, for example, and can be approximated by Expressions (1), (2), and (3).

$$(0°\pm 10°, 0° \text{ to } 20°, \text{any } \psi) \quad \text{Expression (1)}$$

$$(0°\pm 10°, 20° \text{ to } 80°, 0° \text{ to } 60° (1-(\theta-50)^2/900)^{1/2}) \text{ or}$$
$$(0°\pm 10°, 20° \text{ to } 80°, [180°-60° (1-(\theta-50)^2/900)^{1/2}] \text{ to } 180°) \quad \text{Expression (2)}$$

$$(0°\pm 10°, [180°-30° (1-(\psi-90)^2/8100)^{1/2}] \text{ to } 180°, \text{any } \psi) \quad \text{Expression (3)}$$

The Euler angles preferably fall within the range given by Expression (1), Expression (2), or Expression (3) in view of ensuring that the fractional bandwidth is sufficiently wide. The same holds true for the case where the piezoelectric layer 2 is made of lithium tantalate.

Figure 21:
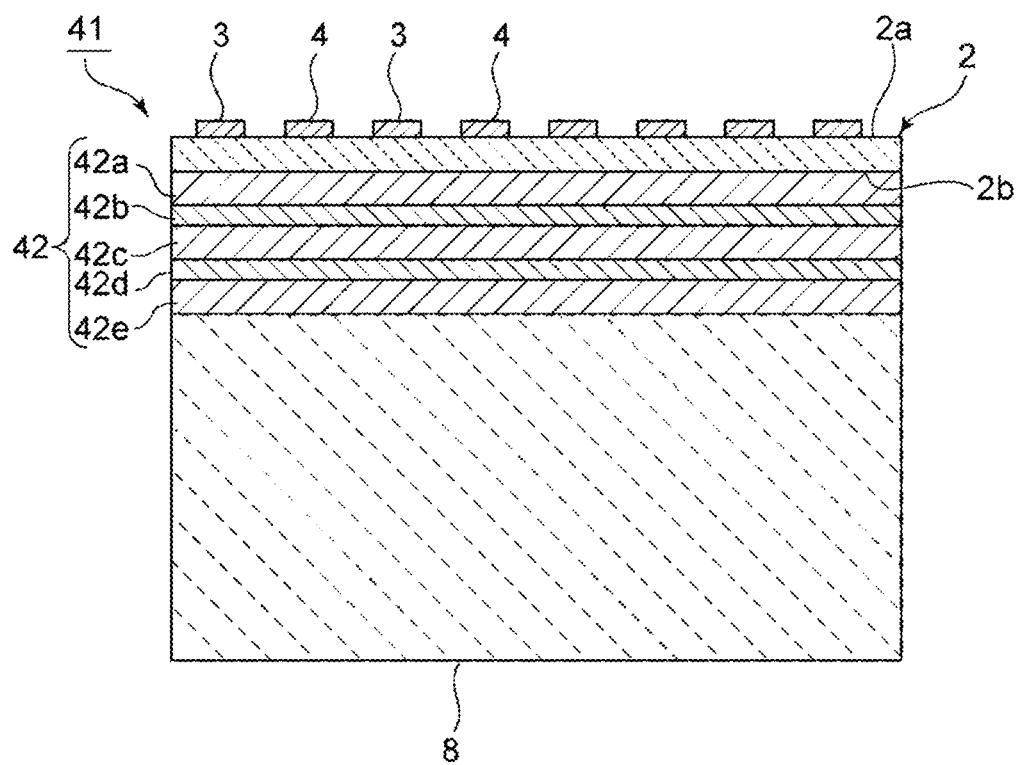
FIG. 21 is a sectional view of an acoustic wave device including a multilayer acoustic film and viewed from the front.

FIG. 21 is a sectional view of an acoustic wave device according to a preferred embodiment of the present invention, illustrating the acoustic wave device viewed from the front. The acoustic wave device, which is denoted by 41, includes a multilayer acoustic film 42 on the second main surface 2b of the piezoelectric layer 2. The multilayer acoustic film 42 includes alternating low- and high-acoustic-impedance layers. The acoustic impedances of the low-acoustic-impedance layers, which are respectively denoted by 42a, 42c, and 42e, is comparatively low. The acoustic impedance of the high-acoustic-impedance layers, which are respectively denoted by 42b and 42d, is comparatively high. The multilayer acoustic film 42 keeps bulk waves in the thickness-shear mode from leaking through the piezoelectric layer 2 and thus eliminates the need for the cavity 9 mentioned above in relation to the acoustic wave device 1. When d/p is less than or equal to about 0.5, for example, the acoustic wave device 41 can exhibit the resonance characteristics attributable to bulk waves in the thickness-shear mode. The number of low-acoustic-impedance layers in the multilayer acoustic film 42 and the number of high-acousticimpedance layers in the multilayer acoustic film 42 are each not limited to a particular value. It is preferred that at least one of the high-acoustic-impedance layers 42b and 42d is farther than the low-acoustic-impedance layers 42a, 42c, and 42e from the piezoelectric layer 2.

The low-acoustic-impedance layers 42a, 42c, and 42e and the high-acoustic-impedance layers 42b and 42d may be made of suitable materials so that the acoustic impedance relationship mentioned above holds for the layers. The low-acoustic-impedance layers 42a, 42c, and 42e may be made of, for example, silicon oxide or silicon oxynitride. The high-acoustic-impedance layers 42b and 42d may be made of, for example, alumina, silicon nitride, or metal.

Figure 22:
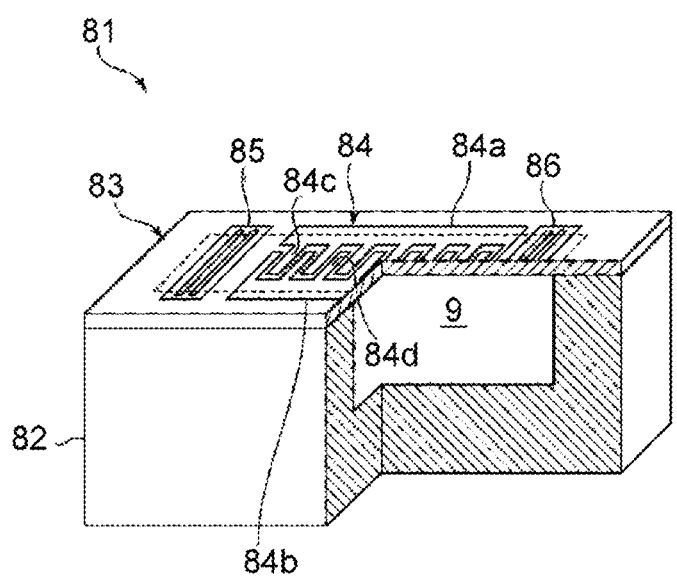
FIG. 22 is a perspective view of an acoustic wave device, a portion of which is cut away for the purpose of explanation of acoustic wave devices that use Lamb waves.

FIG. 22 is a perspective view of an acoustic wave device, a portion of which is cut away for the purpose of explanation of acoustic wave devices that use Lamb waves.

The acoustic wave is denoted by 81 and includes a support substrate 82. The support substrate 82 includes a recess in an upper surface thereof. A piezoelectric layer 83 is disposed on the support substrate 82. The recess closed with the piezoelectric layer 83 is a cavity 9. An IDT electrode 84 is disposed on the piezoelectric layer 83. The IDT electrode 84 is located above the cavity 9. Two reflectors, which are respectively denoted by 85 and 86, are disposed with the IDT electrode 84 therebetween. The reflectors 85 and 86 are located on opposite sides in the propagation direction of acoustic waves. The peripheral edge of the cavity 9 is indicated by a broken line in FIG. 22. The IDT electrode 84 includes a first busbar 84a, a second busbar 84b, first electrode fingers 84c, and second electrode fingers 84d. The first electrode fingers 84c are connected to the first busbar 84a. The second electrode fingers 84d are connected to the second busbar 84b. The first electrode fingers 84c interdigitate with the second electrode fingers 84d.

An alternating electric field applied to the IDT electrode 84 disposed above the cavity 9 causes excitation of a Lamb wave, which is a plate wave. With the reflectors 85 and 86 being disposed on opposites sides, the acoustic wave device 81 can exhibit the resonance characteristics attributable to the Lamb wave.

Acoustic wave devices according to preferred embodiments of the present invention may be of the type that use plate waves, as in the example mentioned above. That is, the first preferred embodiment, the modification of the first preferred embodiment, and the second preferred embodiment may be adapted to the use of plate waves, in which case it is preferred that the IDT electrode 84, the reflector 85, and the reflector 86 (see FIG. 22) be disposed on the piezoelectric layer.

The multilayer acoustic film 42 illustrated in FIG. 21 may be adopted into each preferred embodiment of the present invention and modifications thereof.

As mentioned above, the acoustic wave devices according to the first preferred embodiment, the modification of the first preferred embodiment, and the second preferred embodiment each include acoustic wave resonators that use bulk waves in the thickness-shear mode, and d/p is preferably less than or equal to about 0.5 and is more preferably less than or equal to about 0.24, for example. Accordingly, more favorable resonance characteristics will be exhibited. When the acoustic wave devices according to the first preferred embodiment, the modification of the first preferred embodiment, and the second preferred embodiment each include acoustic wave resonators that use bulk waves in the thickness-shear mode, the acoustic wave resonators are preferably configured in such a manner that the inequality MR about 1.75(d/p)+0.075 holds. This feature more reliably leads to a reduction in spurious emission.

The acoustic wave devices according to the first preferred embodiment, the modification of the first preferred embodiment, and the second preferred embodiment each include acoustic wave resonators that use bulk waves in the thickness-shear mode each preferably include a piezoelectric layer made of lithium niobate or lithium tantalate. The Euler angles (p, θ, ψ) of lithium niobate or lithium tantalate used as the material of the piezoelectric layer preferably fall within the range given by Expression (1), Expression (2), or Expression (3) mentioned above, in view of ensuring that the fractional bandwidth is sufficiently wide.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
   a support substrate;
   a piezoelectric layer located on the support substrate and including a first main surface and a second main surface on opposite sides;
   a functional electrode located on the first main surface or the second main surface of the piezoelectric layer;
   a first trace located on the piezoelectric layer and connected to the functional electrode;
   a second trace located on the piezoelectric layer and facing the first trace, the first and second traces being connected to different potentials; and
   an attenuation layer located between the first trace and the second trace when viewed in plan, the attenuation layer being made of a dielectric material lower in density than the piezoelectric layer.

2. The acoustic wave device according to claim 1, wherein the attenuation layer extends over an entirety of a region between the first trace and the second trace when viewed in plan.

3. The acoustic wave device according to claim 1, further comprising an interlayer located between the piezoelectric layer and the attenuation layer; wherein
   an acoustic impedance of the interlayer is within a range between an acoustic impedance of the piezoelectric layer and an acoustic impedance of the attenuation layer.

4. The acoustic wave device according to claim 3, wherein the acoustic impedance of the piezoelectric layer is higher than the acoustic impedance of the interlayer, and the acoustic impedance of the interlayer is higher than the acoustic impedance of the attenuation layer.

5. The acoustic wave device according to claim 1, wherein the piezoelectric layer is made of lithium tantalate or lithium niobate.

6. The acoustic wave device according to claim 1, wherein the functional electrode includes a first busbar and a second busbar facing each other, at least one first electrode finger connected to the first busbar, and at least one second electrode finger connected to the second busbar.

7. The acoustic wave device according to claim 6, wherein the functional electrode is an IDT electrode including a plurality of the first electrode fingers and a plurality of the second electrode fingers.

8. The acoustic wave device according to claim 7, wherein the acoustic wave device is structured to generate plate waves.

9. The acoustic wave device according to claim 6, wherein the acoustic wave device is structured to generate bulk waves in a thickness-shear mode.

10. The acoustic wave device according to claim 6, wherein d/p is less than or equal to about 0.5, where d represents a thickness of the piezoelectric layer, and p represents a center-to-center distance of the first electrode finger and the second electrode finger that are adjacent to each other.

11. The acoustic wave device according to claim 10, wherein d/p is less than or equal to about 0.24.

12. The acoustic wave device according to claim 9, wherein an inequality MR≤about 1.75(d/p)+0.075 holds, where MR represents a metallization ratio that is a ratio of a sum of an area of the at least one first electrode finger and an area of the at least one second electrode finger to an area of an excitation region in which the first electrode finger and the second electrode finger that are adjacent to each other overlap each other when viewed in a direction in which the first and second electrode fingers face each other.

13. The acoustic wave device according to claim 9, wherein
the piezoelectric layer is made of lithium tantalate or lithium niobate; and
Euler angles ($\varphi$, $\theta$, $\psi$) of lithium niobate or lithium tantalate used as a material of the piezoelectric layer are within a range defined by Expression (1), (2), or (3):

$$(0°\pm10°, 0° \text{ to } 20°, \text{any } \psi) \qquad \text{Expression(1)}$$

$$(0°\pm10°, 20° \text{ to } 80°, 0° \text{ to } 60° (1-(\theta-50)^2/900)^{1/2});$$
$$(0°\pm10°, 20° \text{ to } 80°, [180°-60° (1-(\theta-50)^2/900)^{1/2}] \text{ to } 180°) \qquad \text{Expression (2); and}$$

$$(0°\pm10°, [180°-30° (1-(\psi-90)^2/8100)^{1/2}] \text{ to } 180°, \text{any } \psi) \qquad \text{Expression (3).}$$

14. The acoustic wave device according to claim 1, wherein
the functional electrode includes an upper layer on the first main surface of the piezoelectric layer and a lower electrode on the second main surface of the piezoelectric layer; and
the upper electrode and the lower electrode are located on opposite sides with the piezoelectric layer therebetween.

15. The acoustic wave device according to claim 1, further comprising an insulating layer located between the support substrate and the piezoelectric layer, the support substrate and the insulating layer defining a support.

16. The acoustic wave device according to claim 1, wherein at least one of the insulating layer or the support substrate includes a cavity that overlaps at least a portion of the functional electrode when viewed in plan.

17. The acoustic wave device according to claim 1, wherein the support substrate includes a cavity that overlaps at least a portion of the functional electrode when viewed in plan.

18. The acoustic wave device according to claim 1, further comprising a protective film at least partially covering the functional electrode, the first trace, and the second trace on the piezoelectric layer.

19. The acoustic wave device according to claim 1, wherein at least one cavity is provided in the support substrate to define as an energy-trapping layer.

20. The acoustic wave device according to claim 1, further comprising a multilayer acoustic film on the second main surface of the piezoelectric layer.

* * * * *